US009081291B2

(12) United States Patent
Park et al.

(10) Patent No.: US 9,081,291 B2
(45) Date of Patent: Jul. 14, 2015

(54) RESIST STRIPPING SOLUTION COMPOSITION, AND METHOD FOR STRIPPING RESIST BY USING SAME

(75) Inventors: Myun-Kyu Park, Iksan-si (KR); Tae-Hee Kim, Iksan-si (KR); Jeong-Hyun Kim, Iksan-si (KR); Seung-Yong Lee, Iksan-si (KR); Byoung-Mook Kim, Iksan-si (KR)

(73) Assignee: Dongwoo Fine-Chem Co., Ltd. (KR)

( * ) Notice: Subject to any disclaimer, the term of this patent is extended or adjusted under 35 U.S.C. 154(b) by 551 days.

(21) Appl. No.: 13/387,087

(22) PCT Filed: Aug. 10, 2010

(86) PCT No.: PCT/KR2010/005238
§ 371 (c)(1),
(2), (4) Date: Apr. 9, 2012

(87) PCT Pub. No.: WO2011/019189
PCT Pub. Date: Feb. 17, 2011

(65) Prior Publication Data
US 2012/0181248 A1    Jul. 19, 2012

(30) Foreign Application Priority Data
Aug. 11, 2009  (KR) .................. 10-2009-0073762

(51) Int. Cl.
*G03F 7/42* (2006.01)
*C11D 11/00* (2006.01)

(52) U.S. Cl.
CPC ............ *G03F 7/425* (2013.01); *C11D 11/0047* (2013.01)

(58) Field of Classification Search
CPC ............. C11D 11/0047; C11D 7/3263; C11D 3/2065; C11D 7/3218
USPC .................................. 510/175, 176
See application file for complete search history.

(56) References Cited

U.S. PATENT DOCUMENTS 8,017,298 B2 * 9/2011 Tsubaki ................. 430/270.1
2006/0116313 A1 * 6/2006 Geitz et al. .................. 510/499
(Continued)

FOREIGN PATENT DOCUMENTS

| CN | 1758144 | 4/2006 |
|---|---|---|
| CN | 1784487 A | 6/2006 |
| CN | 1904016 | 1/2007 |

(Continued)

OTHER PUBLICATIONS

"Chinese Application No. 201080034160.8, English translation of First Office Action issued Feb. 27, 2013", 10 pgs.
(Continued)

*Primary Examiner* — Gregory Webb
(74) *Attorney, Agent, or Firm* — Schwegman Lundberg & Woessner, P.A.

(57) ABSTRACT

Disclosed is a resist stripping solution composition, which is highly capable of removing a resist pattern and an etching residue after dry etching or wet etching, manifests excellent anticorrosive effects on metal wiring including aluminum and/or copper because a predetermined polyol compound is used, and also can process a number of substrates because a predetermined amide compound is used, thus greatly contributing to reducing the cost. A method of stripping a resist using the resist stripping solution composition is also provided.

12 Claims, 1 Drawing Sheet

(56) References Cited

U.S. PATENT DOCUMENTS

2006/0293208 A1* 12/2006 Egbe et al. .................... 510/407
2010/0152086 A1* 6/2010 Wu et al. ........................ 510/175

FOREIGN PATENT DOCUMENTS

| JP | 11-256188 | 9/1999 |
|----|-----------|--------|
| KR | 10-2000-0004910 | 1/2000 |
| KR | 10-2003-0015392 | 2/2003 |
| KR | 10-2004-0104622 | 12/2004 |
| WO | WO-2006062534 A1 | 6/2006 |

OTHER PUBLICATIONS

"International Application No. PCT/KR2010/005238, International Search Report mailed Apr. 22, 2011", 5 pgs.

* cited by examiner

RESIST STRIPPING SOLUTION COMPOSITION, AND METHOD FOR STRIPPING RESIST BY USING SAME

PRIORITY CLAIM TO RELATED APPLICATIONS

This application is a national stage application under 35 U.S.C. §371 of PCT/KR2010/005238, filed Aug. 10, 2010, and published as WO 2011/019189 A2 on Feb. 17, 2011, which claims priority to Korean Application No. 10-2009-0073762, filed Aug. 11, 2009, which applications and publication are incorporated herein by reference and made a part hereof in their entirety, and the benefit of priority of each of which is claimed herein.

TECHNICAL FIELD

The present invention relates to a resist stripping solution composition and a method of stripping a resist using the same, and more particularly to a resist stripping solution composition which is able to effectively remove a resist pattern and an etching residue in the course of manufacturing a flat panel display and also does not damage aluminum (Al) and/or copper (Cu) wiring, and to a method of stripping a resist using the same.

BACKGROUND ART

As the demand for high resolution flat displays is recently increasing, many attempts are being made to increase the number of pixels per unit area. This trend requires decreasing the pattern width, and in order to cope therewith, process conditions become more severe, including the use of dry etching. In addition, as the size of flat displays increases, signal speeds in the wiring should be increased, and thus Cu having resistivity lower than Al is actually utilized as the wiring material. Accordingly, the performance demanded of a stripper used in the stripping process which removes a resist should be enhanced. Specifically, stripping properties should reach a considerable level in terms of the ability to remove an etching residue generated after dry etching and the ability to inhibit corrosion of the metal wiring. In particular, a stripper that has the ability to inhibit corrosion of Cu, as well as Al, is being required. The stripper should also generate economic benefits such as increasing the number of processing sheets of substrates in order to ensure price competitiveness.

DISCLOSURE

Technical Problem

Accordingly, the present invention is intended to provide a resist stripping solution composition, which is highly capable of removing a resist pattern and an etching residue after dry etching or wet etching and which prevents metal wiring including Al and/or Cu from corrosion and also which increases the number of processing sheets of substrates thus generating economic benefits, and also to provide a method of stripping a resist using the same.

Technical Solution

An aspect of the present invention provides a resist stripping solution composition, comprising (a) a basic compound including one or more selected from among compounds represented by Formulas 1 to 3 below, (b) an amide compound represented by Formula 4 below, (c) a polar solvent, and (d) a polyol compound represented by Formula 5 below:

[Formula 1]

[Formula 2]

[Formula 3]

wherein $R_1$, $R_2$, $R_3$, $R_4$, $R_5$ and $R_6$ are each independently hydrogen, a C1~10 alkyl group substituted or unsubstituted with amino, a C2~10 alkenyl group, a C1~10 hydroxyalkyl group, a carboxylic group, a C1~10 alkyl group substituted with C1~10 alkoxy substituted or unsubstituted with hydroxyl, an amino group substituted or unsubstituted with C1~4 alkyl, a phenyl group, or a benzyl group;

[Formula 4]

wherein $R_7$, $R_8$ and $R_9$ are each independently hydrogen, a C1~10 alkyl group, a C2~10 alkenyl group, a C1~10 hydroxyalkyl group, a carboxylic group, a C1~10 alkyl group substituted with C1~10 alkoxy, or an amino group substituted or unsubstituted with C1~4 alkyl, and $R_7$ and $R_8$ together may form a ring; and

[Formula 5]

wherein $R_{10}$ and $R_{11}$ are each independently hydrogen, a C1~10 alkylene group, a C2~10 alkenylene group, a C1~10 hydroxyalkylene group, a carbonyl group, a C1~10 alkylene group substituted with C1~10 alkoxy, or a bond.

Another aspect of the present invention provides a method of stripping a resist, comprising (I) depositing a conductive metal layer on a substrate for a flat panel display, (II) forming a resist layer on the conductive metal layer, (III) subjecting the resist layer to selective photo-exposure, (IV) developing the resist layer, thus forming a resist pattern, (V) etching the conductive metal layer using the resist pattern as a mask, and (VI) stripping the resist which was deteriorated and cured due to the forming of the resist pattern and the etching, from the substrate using the resist stripping solution composition according to the present invention.

Advantageous Effects

According to the present invention, a resist stripping solution composition is highly capable of removing a resist pattern and an etching residue after dry etching or wet etching and preventing the corrosion of metal wiring including Al and/or Cu, and thus can be effectively utilized to fabricate a flat panel display having a fine pattern in order to obtain high resolution and, also which can be used to fabricate a flat panel display having Cu wiring. Furthermore, it is possible to process a number of substrates, thus greatly contributing to lowering the cost.

BEST MODE

The present invention pertains to a resist stripping solution composition comprising (a) a basic compound including one or more selected from among compounds represented by Formulas 1 to 3 below, (b) an amide compound represented by Formula 4 below, (c) a polar solvent, and (d) a polyol compound represented by Formula 5 below.

[Formula 1]

[Formula 2]

[Formula 3]

In Formulas 1 to 3, $R_1$, $R_2$, $R_3$, $R_4$, $R_5$ and $R_6$ are each independently hydrogen, a C1~10 alkyl group substituted or unsubstituted with amino, a C2~10 alkenyl group, a C1~10 hydroxyalkyl group, a carboxylic group, a C1~10 alkyl group substituted with C1~10 alkoxy substituted or unsubstituted with hydroxyl, an amino group substituted or unsubstituted with C1~4 alkyl, a phenyl group, or a benzyl group.

[Formula 4]

In Formula 4, $R_7$, $R_8$ and $R_9$ are each independently hydrogen, a C1~10 alkyl group, a C2~10 alkenyl group, a C1~10 hydroxyalkyl group, a carboxylic group, a C1~10 alkyl group substituted with C1~10 alkoxy, or an amino group substituted or unsubstituted with C1~4 alkyl, and $R_7$ and $R_8$ together may form a ring.

[Formula 5]

In Formula 5, $R_{10}$ and $R_{11}$ are each independently hydrogen, a C1~10 alkylene group, a C2~10 alkenylene group, a C1~10 hydroxyalkylene group, a carbonyl group, a C1~10 alkylene group substituted with C1~10 alkoxy, or a bond.

Hereinafter, the present invention is described in detail.

In the resist stripping solution composition according to the present invention, the (a) basic compound including one or more selected from among compounds represented by Formulas 1 to 3 functions to extensively infiltrate into the polymer matrix of the resist that was deteriorated or crosslinked under various process conditions of dry or wet etching, ashing or ion implant processing to thus break the intra or intermolecular bond. This basic compound plays a role in forming the empty space in a structurally weak portion of the resist remaining on the substrate, so that the resist is transformed into a lump of amorphous polymeric gel, thereby facilitating the removal of the resist attached to the upper surface of the substrate.

Examples of the basic compound represented by Formula 1 include primary amines, such as methylamine, ethylamine, monoisopropylamine, n-butylamine, sec-butylamine, isobutylamine, t-butylamine, and pentylamine; secondary amines, such as dimethylamine, diethylamine, dipropylamine, diisopropylamine, dibutylamine, diisobutylamine, methylethylamine, methylpropylamine, methylisopropylamine, methylbutylamine, and methylisobutylamine; tertiary amines, such as trimethylamine, triethylamine, tripropylamine, tributylamine, tripentylamine, dimethylethylamine, methyldiethylamine, and methyldipropylamine; alkanolamines, such as monoethanolamine, diethanolamine, triethanolamine, monopropanolamine, 2-aminoethanol, 2-(ethylamino)ethanol, 2-(methylamino)ethanol, N-methyldiethanolamine, N,N-dimethylethanolamine, N,N-diethylaminoethanol, 2-(2-aminoethylamino)-1-ethanol, 1-amino-2-propanol, 2-amino-1-propanol, 3-amino-1-propanol, 4-amino-1-butanol, and dibutanolamine; and alkoxyamines, such as (butoxymethyl)diethylamine, (methoxymethyl)diethylamine, (methoxymethyl)dimethylamine, (butoxymethyl)dimethylamine, (isobutoxymethyl)dimethylamine, (methoxymethyl)diethanolamine, (hydroxyethyloxymethyl)diethylamine, methyl (methoxymethyl)aminoethane, methyl(methoxymethyl)aminoethanol, methyl(butoxymethyl)aminoethanol, and 2-(2-aminoethoxy)ethanol, which may be used alone or in mixtures of two or more thereof. Among them, particularly useful is monoethanolamine, triethanolamine, 1-amino-2-propanol, 2-(2-aminoethoxy)ethanol, N-methylethanolamine, N-methyldiethanolamine, N,N-dimethylethanolamine, N,N-diethylaminoethanol, or 2-(2-aminoethylamino)-1-ethanol.

Examples of the basic compound represented by Formula 2 include morpholine, N-(3-aminopropyl)morpholine, N-(methoxymethyl)morpholine, N-(butoxymethyl)morpholine, and N-(2-hydroxyethyl)morpholine, which may be used alone or in mixtures of two or more thereof. Particularly useful is N-(2-hydroxyethyl)morpholine.

Examples of the basic compound represented by Formula 3 include piperazine, 1-methylpiperazine, 2-methylpiperazine, 1,4-dimethylpiperazine, 1,4-diethylpiperazine, 1-(2-hydroxyethyl)piperazine, 1-(2-hydroxyethyl)-4-methylpiperazine, 1-(2-aminoethyl)piperazine, 1-amino-4-methylpiperazine, 1-benzylpiperazine, 1-phenylpiperazine, N,N'-di(methoxymethyl)piperazine, N,N'-di(butoxymethyl)piperazine, and di(butoxymethyl)piperazine, which may be used alone or in mixtures of two or more thereof. Particularly useful is 1-(2-hydroxyethyl)piperazine.

The (a) basic compound including one or more selected from among compounds represented by Formulas 1 to 3 may be used in an amount of 5~30 wt % based on the total weight of the composition. In the case where the amount of this component falls within the above range, the resist stripping solution composition according to the present invention may exhibit preferable stripping performance without problems of poor resist stripping effects or a rapid increase in the etching rate for Al or Cu wiring.

In the resist stripping solution composition according to the present invention, the (b) amide compound represented by Formula 4 is a strong alkaline aprotic polar solvent and is very effective in decomposing or dissolving the resist polymer that was deteriorated or crosslinked by dry etching or the like, and is superior in terms of the ability to dissolve the resin which is a main material of the resist, compared to other polar solvents.

Specific examples of the (b) amide compound represented by Formula 4 include formamide, N-methylformamide, N,N-dimethylformamide, acetamide, N-methylacetamide, N,N-dimethylacetamide, N-(2-hydroxyethyl)acetamide, 3-methoxy-N,N-dimethylpropionamide, 3-(2-ethylhexyloxy)-N,N-dimethylpropionamide, and 3-butoxy-N,N-dimethylpropionamide, which may be used alone or in mixtures of two or more thereof. Particularly useful is N-methylformamide, N,N-dimethylformamide, N-methylacetamide, or N,N-dimethylacetamide.

The (b) amide compound represented by Formula 4 may be used in an amount of 20~80 wt % based on the total weight of the composition. In the case where the amount of this component falls within the above range, it is favorable for removing the resist polymer that was deteriorated or crosslinked by etching or the like, and also for increasing the number of processing sheets.

In the resist stripping solution composition according to the present invention, the (c) polar solvent plays a role to assist the (b) amide compound, so that the resist polymer gelled by the (a) basic compound is dissolved, and also to facilitate the removal of the stripper by water upon deionized water (DI) rinsing after resist stripping, so that the re-deposit of the dissolved resist is minimized in the stripper. Furthermore, this component plays a role in improving the performance of the (a) basic compound to thus infiltrate the deteriorated or crosslinked resist, thereby breaking the intra or intermolecular bond.

Examples of the (c) polar solvent may include protic polar solvents and aprotic polar solvents, which may be used alone or in mixtures. Specific examples of the protic polar solvents include ethyleneglycol monomethyl ether, ethyleneglycol monoethyl ether, ethyleneglycol monoisopropyl ether, ethyleneglycol monobutyl ether, diethyleneglycol monomethyl ether, diethyleneglycol monoethyl ether, diethyleneglycol monoisopropyl ether, diethyleneglycol monobutyl ether, triethyleneglycol monomethyl ether, triethyleneglycol monoethyl ether, triethyleneglycol monoisopropyl ether, triethyleneglycol monobutyl ether, polyethyleneglycol monomethyl ether, polyethyleneglycol monobutyl ether, propyleneglycol monomethyl ether, dipropyleneglycol monomethyl ether, tripropyleneglycol monomethyl ether, propyleneglycol monomethyl ether acetate, and alcohols having a cyclic ether bond, which may be used alone or in mixtures of two or more thereof. Examples of the alcohols having a cyclic ether bond include furfuryl alcohols, tetrahydrofurfuryl alcohols and so on.

Specific examples of the aprotic polar solvents include pyrrolidone compounds such as N-methylpyrrolidone (NMP), and N-ethylpyrrolidone; imidazolidinone compounds such as 1,3-dimethyl-2-imidazolidinone, and 1,3-dipropyl-2-imidazolidinone; lactone compounds such as γ-butyrolactone; sulfoxides such as dimethylsulfoxide (DMSO), and sulfolane; phosphate compounds such as triethylphosphate, and tributylphosphate; and carbonate compounds such as dimethylcarbonate, and ethylenecarbonate, which may be used alone or in mixtures of two or more thereof.

The (c) polar solvent may be used in an amount of 10~70 wt % based on the total weight of the composition. In the case where the amount of this component falls within the above range, there is no need to be concerned about reducing the number of processing sheets due to water decreasing the cleaning capability of the stripper nor about problems related to the amounts of basic compound and amide compound being drastically reduced.

The (c) polar solvent preferably includes one or more protic polar solvents and one or more aprotic polar solvents. Also, it may preferably include one or more alcohols having a cyclic ether bond.

In the resist stripping solution composition according to the present invention, the (d) polyol compound represented by Formula 5 functions to prevent corrosion of metal wiring including Al or Cu. Such a polyol compound forms a bond with a metal layer under the resist, thus preventing the corrosion of the metal layer by the hydroxyl group of the stripper composition.

Specific examples of the (d) polyol compound represented by Formula 5 include cyclohexane 1,4-diol, cyclohexane 1,4-dimethanol and cyclohexane 1,4-diethanol, which may be used alone or in mixtures of two or more thereof.

The (d) polyol compound may be used in an amount of 0.05~20 wt % based on the total weight of the composition. In the case where the amount of this component falls within the above range, it may exhibit preferable anticorrosive effects on a metal layer made of Al or Cu and be highly capable of removing the resist and the residue.

Also, the resist stripping solution composition according to the present invention may further comprise water to increase the activity of the (a) basic compound in the stripper so as to increase the ability to remove a resist and a dry etching reside.

Also, the resist stripping solution composition according to the present invention may further comprise a surfactant in addition to the above components. The surfactant functions to increase wettability for a substrate thus enabling uniform cleaning, and also to enhance interfacial permeability resulting in increased resist strippability.

Examples of the surfactant usable in the present invention include an anionic surfactant, a cationic surfactant, and a non-ionic surfactant. Particularly useful is a non-ionic surfactant having higher wettability and lower foamability.

Examples of the non-ionic surfactant include polyoxyethylene alkyl ether type, polyoxyethylene alkylphenyl ether type, polyoxyethylene polyoxypropylene alkyl ether type, polyoxyethylene polyoxybutylene alkyl ether type, polyoxyethylene alkylamino ether type, polyoxyethylene alkylamido ether type, polyethyleneglycol fatty acid ester type, sorbitan fatty acid ester type, glycerin fatty acid ester type, alkylolamide type, and glycerin ester type surfactants, which may be used alone or in mixtures of two or more thereof.

The surfactant may be used in an amount of 0.001~1.0 wt % based on the total weight of the composition. In the case where the amount of this component falls within the above range, it is favorable for uniform stripping of the substrate, and also for preventing difficulties in handling the stripper due to a heavy foamability of the stripper.

The resist stripping solution composition according to the present invention may comprise, based on the total weight of the composition, (a) 5~30 wt % of the basic compound including one or more selected from among compounds represented by Formulas 1 to 3, (b) 20~80 wt % of the amide compound represented by Formula 4, (c) 10~70 wt % of the polar solvent, and (d) 0.05~20 wt % of the polyol compound represented by Formula 5.

The resist stripping solution composition according to the present invention may be prepared by favorably mixing the above compounds in predetermined amounts. As such, the mixing process is not particularly limited, and a variety of known processes may be used without limitation.

In addition, the present invention pertains to a flat panel for a display and a flat panel display, both of which are manufactured using the resist stripping solution composition according to the present invention.

In addition, the present invention pertains to a method of stripping a resist using the resist stripping solution composition according to the present invention. This method includes (I) depositing a conductive metal layer on a substrate for a flat panel display, (II) forming a resist layer on the conductive metal layer, (III) subjecting the resist layer to selective photo-exposure, (IV) developing the resist layer, thus forming a resist pattern, (V) etching the conductive metal layer using the resist pattern as a mask, and (VI) stripping the resist that was deteriorated and cured by the resist pattern formation and etching, from the substrate using the resist stripping solution composition according to the present invention.

Also, the stripping method according to the present invention includes performing dry etching such as etchback processing or CMP (Chemical Mechanical Polishing) followed by stripping the exposed resist layer using the resist stripping solution composition according to the present invention, without forming the resist pattern using a mask.

In the stripping process, formation of the resist layer, photo-exposure, development, etching and ashing may be carried out by methods known in the art.

The kind of the resist includes positive/negative g-rays, i-rays and deep UV (DUN) resists, an e-beam resist, an X-ray resist, an ion beam resist, etc. Although the constitution thereof is not limited, the resist to which the resist stripping solution composition according to the present invention may be effectively applied is a photoresist comprising a novolac phenol resin or a photoactive compound such as diazonaphthoquinone or the mixtures thereof.

Removing a resist on a substrate for a flat panel display, a deteriorated or cured resist or a dry etching residue using the resist stripping solution composition according to the present invention includes immersing a resist-applied substrate in a stripper or spraying a stripper onto the corresponding substrate. Also in this case, physical treatment including sonication or using a brush that rotates or vibrates side-to-side may be used together. After stripper processing, the stripper remaining on the substrate may be removed by continuous cleaning processing. The cleaning process is the same as the stripping process with the exception that water or isopropylalcohol is used in lieu of the stripper.

The stripping method may include either or both of immersion and spraying. In the case where stripping is carried out using either or both of immersion and spraying, the stripping conditions include a temperature of about 15~100° C., preferably 30~70° C., and a period of time required to perform either or both of immersion and spraying ranging from 30 sec to 40 min, preferably from 1 min to 20 min. However, in the present invention, the above conditions are not strictly applied, and may be modified easily and appropriately by those skilled in the art. If the temperature of the stripper composition applied on the resist-applied substrate is lower than 15° C., the period of time required to remove the deteriorated or cured resist layer may be excessively lengthened. In contrast, if the temperature of the composition exceeds 100° C., the layer under the resist may be damaged, making it difficult to handle the stripper.

According to the present invention, the resist stripping solution composition and the stripping method using the same may be utilized to remove not only a typical resist but also a resist, which was deteriorated or cured by an etching gas and high temperature, and an etching residue. Furthermore, when the resist stripping solution composition and the stripping method using the same are utilized to manufacture a flat panel display, superior anticorrosive effects on metal wiring including Al or Cu may result.

In addition, the present invention pertains to a method of manufacturing a flat panel for a display, including stripping a resist from a flat panel substrate using the resist stripping solution composition according to the present invention.

In addition, the present invention pertains to a method of manufacturing a flat panel display, including stripping a resist from a flat panel substrate using the resist stripping solution composition according to the present invention.

The flat panel for a display and the flat panel display manufactured using the above methods are advantageous because the resist is completely removed during the manufacturing procedure, and corrosion of the metal wiring including Al and/or Cu seldom occurs, resulting in a high quality product.

[Mode for Invention]

A better understanding of the present invention may be obtained through the following examples which are set forth to illustrate, but are not to be construed as limiting the present invention.

Examples 1~6 and Comparative Example 1

Preparation of Resist Stripping Solution Composition

Resist stripping solution compositions were prepared by mixing components in the amounts shown in Table 1 below.

TABLE 1

| | Basic Compound [wt %] | | Amide Compound [wt %] | | Polar Solvent [wt %] | | | | Polyol Compound [wt %] | |
|---|---|---|---|---|---|---|---|---|---|---|
| Ex. 1 | MEA | 10 | NMF | 40 | NMP | 24.5 | MDG | 25 | CHDM | 0.5 |
| Ex. 2 | NMEA | 10 | NMF | 40 | NMP | 24.5 | MDG | 25 | CHDM | 0.5 |
| Ex. 3 | MDEA | 10 | NMF | 40 | NMP | 24.5 | MDG | 25 | CHDM | 0.5 |

TABLE 1-continued

|  | Basic Compound [wt %] | | Amide Compound [wt %] | | Polar Solvent [wt %] | | | | Polyol Compound [wt %] | |
|---|---|---|---|---|---|---|---|---|---|---|
| Ex. 4 | DMEA | 10 | NMF | 40 | NMP | 24.5 | MDG | 25 | CHDM | 0.5 |
| Ex. 5 | HEM | 10 | NMF | 40 | NMP | 24.5 | MDG | 25 | CHDM | 0.5 |
| Ex. 6 | HEP | 10 | NMF | 40 | NMP | 24.5 | MDG | 25 | CHDM | 0.5 |
| C. Ex. 1 | — | — | NMF | 50 | NMP | 24.5 | MDG | 25 | CHDM | 0.5 |

Note)
MEA: monoethanolamine
NMEA: N-methylethanolamine
MDEA: N-methyldiethanolamine
DMEA: N,N-dimethylethanolamine
HEM: N-(2-hydroxyethyl)morpholine
HEP: 1-(2-hydroxyethyl)piperazine
NMF: N-methylformamide
NMP: N-methyl pyrrolidone
MDG: diethylene glycol monomethyl ether
CHDM: cyclohexane 1,4-dimethanol Test Example 1

Evaluation of Resist Removal Performance Depending on Kind and Use of Basic Compound In order to evaluate stripping effects of the resist stripping solution compositions of Examples 1~6 and Comparative Example 1, according to a typical method, a wet etched substrate and a dry etched substrate were prepared by forming a Mo/Al layer on a glass substrate using thin film sputtering, forming a photoresist pattern, and wet etching or dry etching the metal layer. The resist stripping solution composition of each of Examples 1~6 and Comparative Example 1 was uniformly maintained at 50° C. using a thermostat, the target was immersed therein for 10 min, and the strippability of the resist stripping solution composition was determined. Thereafter, in order to remove the stripper remaining on the substrate, the substrate was cleaned with DI for 1 min, and was then completely dried using nitrogen to remove DI from the cleaned substrate. The degree of removing the deteriorated or cured resist and the dry etching residue from the substrate was observed using SEM (Hitachi S-4700). The results are shown in Table 2 below.

TABLE 2

|  | Stripping Performance | |
|---|---|---|
|  | Wet Etched Substrate | Dry Etched Substrate |
| Ex. 1 | ⊚ | □ |
| Ex. 2 | ⊚ | ⊚ |
| Ex. 3 | ⊚ | ○ |
| Ex. 4 | ⊚ | ○ |
| Ex. 5 | ⊚ | ○ |
| Ex. 6 | ⊚ | ○ |
| C. Ex. 1 | Δ | X |

Note)
[Stripping Performance] ⊚: very good, ○: good, Δ: fair, X: poor

As shown from Table 2, the resist stripping solution compositions of Examples 1 to 6 exhibited excellent resist strippability after wet etching and superior performance of removing the resist and the etching residue after dry etching. Whereas, the composition of Comparative Example 1 having no basic compound showed fair performance for the resist after wet etching but is poor in terms of removing the resist and the etching residue after dry etching.

Examples 7~9 and Comparative Example 2

Preparation of Resist Stripping Solution Composition

Resist stripping solution compositions were prepared by mixing components in the amounts shown in Table 3 below.

TABLE 3

|  | Basic Compound [wt %] | | Amide Compound [wt %] | | Polar Solvent [wt %] | | | | Polyol Compound [wt %] | |
|---|---|---|---|---|---|---|---|---|---|---|
| Ex. 7 | MDEA | 10 | NMF | 20 | NMP | 44.5 | MDG | 25 | CHDM | 0.5 |
| Ex. 8 | MDEA | 10 | NMF | 70 | NMP | 9.5 | MDG | 10 | CHDM | 0.5 |
| Ex. 9 | MDEA | 10 | DMAc | 40 | NMP | 24.5 | MDG | 25 | CHDM | 0.5 |
| C. Ex. 2 | MDEA | 10 | NMF | — | NMP | 64.5 | MDG | 25 | CHDM | 0.5 |

Note)
DMAc: N,N-dimethyl acetamide

Test Example 2

Evaluation of Performance Depending on Kind and Use of Amide Compound

The stripping performance of the resist stripping solution compositions of Examples 7 to 9 and Comparative Example 2, which are prepared with or without the amide compound and to contain the various kind and amount of polar solvent, was evaluated. The same substrates as in Test Example 1 were used to determine the resist removal performance, and the test was performed under the same processing conditions. The results are shown in Table 4 below.

TABLE 4

|  | Stripping Performance | |
|---|---|---|
|  | Wet Etched Substrate | Dry Etched Substrate |
| Ex. 7 | ◎ | ○ |
| Ex. 8 | ◎ | ◎ |
| Ex. 9 | ◎ | ○ |
| C. Ex. 2 | ○ | X |

Note)
[Stripping Performance] ◎: very good, ○: good, Δ: fair, X: poor

As shown from Table 4, the resist stripping solution compositions of Examples 7 to 9 exerted superior resist strippability after wet etching or dry etching. However, the composition of Comparative Example 2 having no amide compound showed poor resist removal performance for the dry etched substrate.

Examples 3, 10~12 and Comparative Example 3

Preparation of Resist Stripping Solution Composition

Resist stripping solution compositions were prepared by mixing components in the amounts shown in Table 5 below.

TABLE 5

| | Basic Compound [wt %] | | Amide Compound [wt %] | | Polar Solvent [wt %] | | | | Polyol Compound [wt %] | |
|---|---|---|---|---|---|---|---|---|---|---|
| Ex. 3 | MDEA | 10 | NMF | 40 | NMP | 24.5 | MDG | 25 | CHDM | 0.5 |
| Ex. 10 | MDEA | 10 | NMF | 40 | NMP | 24.5 | BDG | 25 | CHDM | 0.5 |
| Ex. 11 | MDEA | 10 | NMF | 40 | NMP | 24.5 | THFA | 25 | CHDM | 0.5 |
| Ex. 12 | MDEA | 10 | NMF | 64.5 | NMP | — | MDG | 25 | CHDM | 0.5 |
| C. Ex. 3 | MDEA | 10 | NMF | 89.5 | NMP | — | MDG | — | CHDM | 0.5 |

Note)
BDG: Diethylene glycol monobutyl ether
THFA: Tetrahydrofurfuryl alcohol

Test Example 3

Evaluation of the Number of Processing Sheets Depending on Use of Polar Solvent The performance of a stripper in terms of the number of processing sheets of substrates was indirectly evaluated using the resist stripping solution compositions of Examples 3, 10~12 and Comparative Example 3 prepared with or without the polar solvent.

Specifically, in order to evaluate the number of processing sheets of substrates for the resist stripping solution compositions of Examples 3, 10~12 and Comparative Example 3, a Mo/Al wiring-exposed substrate was immersed at 50° C. for 10 min in the stripper composition in which a solidified photoresist (obtained by completely removing the solvent using thermal treatment at 130° C. for one day) was sequentially dissolved in the concentration range of 1~5 wt %, followed by performing cleaning and drying, after which the point of time at which the residue was generated was observed using SEM (Hitachi S-4700). The results are shown in Table 6 below.

TABLE 6

| | Solidified Photoresist Concentration | | | | | |
|---|---|---|---|---|---|---|
| | 0 wt % | 1 wt % | 2 wt % | 3 wt % | 4 wt % | 5 wt % |
| Ex. 3 | ◎ | ◎ | ◎ | ○ | Δ | X |
| Ex. 10 | ◎ | ◎ | ◎ | ○ | Δ | X |
| Ex. 11 | ◎ | ◎ | ◎ | ○ | ○ | Δ |
| Ex. 12 | ◎ | ◎ | ○ | Δ | X | |
| C. Ex. 3 | ◎ | ○ | Δ | X | X | X |

Figure 1:
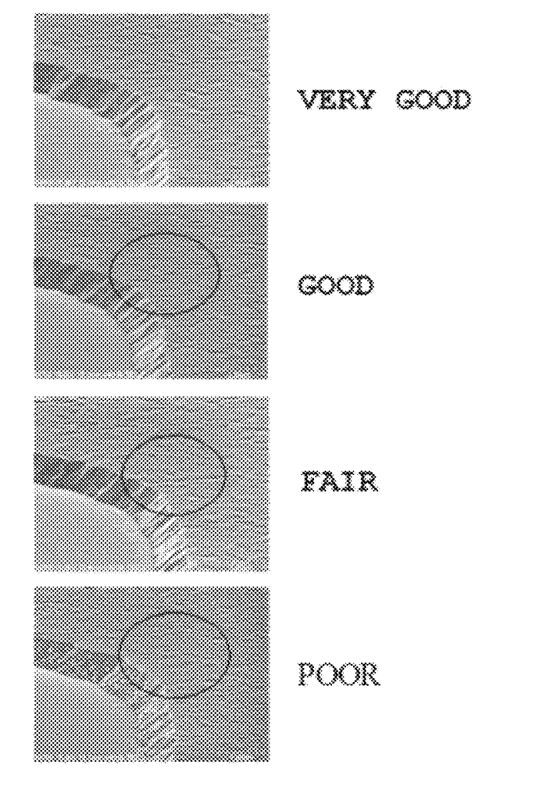
FIG. 1 is of scanning electron microscope (SEM) images showing the criteria used to evaluate the number of processing sheets in Test Example 3 according to the present invention.

Note)
[Evaluation of Performance] ◎: very good, ○: good, Δ: fair, X: poor (criteria, see FIG. 1)

As shown from Table 6, the resist stripping solution compositions of Examples 3, 10~12 began to generate the residue from the point of time at which the solidified photoresist was dissolved at 3~4 wt %. However, in Comparative Example 3 having no polar solvent, the residue began to occur from 1~2 wt %. In particular, the resist stripping solution composition of Example 11 containing an alcohol having a cyclic ether bond as the polar solvent exhibited a very high ability to inhibit the generation of a residue even in the presence of a highly concentrated, solidified photoresist. Thus, the resist stripping solution composition according to the present invention can be confirmed to process more substrates than does the conventional stripper composition.

Example 3, 11, 13, 14 and Comparative Example 4

Preparation of Resist Stripping Solution Composition

Resist stripping solution compositions were prepared by mixing components in the amounts shown in Table 7 below.

TABLE 7

| | Basic Compound [wt %] | | Amide Compound [wt %] | | Polar Solvent [wt %] | | | | Polyol Compound [wt %] | |
|---|---|---|---|---|---|---|---|---|---|---|
| Ex. 3 | MDEA | 10 | NMF | 40 | NMP | 24.5 | MDG | 25 | CHDM | 0.5 |
| Ex. 11 | MDEA | 10 | NMF | 40 | NMP | 24.5 | THFA | 25 | CHDE | 0.5 |
| Ex. 13 | MDEA | 10 | NMF | 40 | NMP | 24.9 | MDG | 25 | CHDM | 0.1 |
| Ex. 14 | MDEA | 10 | NMF | 40 | NMP | 23 | MDG | 25 | CHDM | 2 |
| C. Ex. 4 | MDEA | 10 | NMF | 40 | NMP | 25 | MDG | 25 | — | — |

Note)
CHDM: cyclohexane 1,4-diethanol

Test Example 4

Evaluation of Anticorrosive Performance Depending on Use of Polyol Compound

The anticorrosive performance on metal wiring was evaluated using the resist stripping solution compositions of Examples 3, 11, 13, 14 and Comparative Example 4 prepared with or without the polyol compound and by changing the kind of polyol compound. Specifically, the anticorrosive performance of the resist stripping solution compositions of Examples 3, 11, 13, 14 and Comparative Example 4 was evaluated using Mo/Al wiring- and Cu/Mo—Ti wiring-exposed substrates. The anticorrosive performance on metal wiring was measured by immersing the substrate in the stripper composition at 60° C. for 30 min, performing cleaning and drying, and observing the substrate using SEM (Hitachi S-4700). The results are shown in Table 8 below.

TABLE 8

| | Al Anticorrosion | Cu Anticorrosion |
|---|---|---|
| Ex. 3 | ⊚ | ⊚ |
| Ex. 11 | ⊚ | ⊚ |
| Ex. 13 | ○ | ○ |
| Ex. 14 | ⊚ | ⊚ |
| C. Ex. 4 | X | □ |

Note)
[Anticorrosive Performance] ⊚: very good, ○: good, □: fair, X: poor

As shown from Table 8, the resist stripping solution compositions of Examples 3, 11, 13 and 14 exhibited superior anticorrosive performance on metal wiring, whereas the composition of Comparative Example 4 having no polyol compound exerted poor anticorrosive performance.

Examples 3, 11, 15 and 16

Preparation of Resist Stripping Solution Composition

Resist stripping solution compositions were prepared by mixing components in the amounts shown in Table 9 below.

TABLE 9

| | Basic Compound [wt %] | | Amide Compound [wt %] | | Polar Solvent [wt %] | | | | Polyol Compound [wt %] | |
|---|---|---|---|---|---|---|---|---|---|---|
| Ex. 3 | MDEA | 10 | NMF | 40 | NMP | 24.5 | MDG | 25 | CHDM | 0.5 |
| Ex. 11 | MDEA | 10 | NMF | 40 | NMP | 24.5 | THFA | 25 | CHDM | 0.5 |
| Ex. 15 | MDEA | 10 | NMF | 65 | NMP | 24.5 | MDG | — | CHDM | 0.5 |
| Ex. 16 | MDEA | 10 | NMF | 40 | NMP | 24.5 | MDG/THFA | 20/5 | CHDE | 0.5 |

Test Example 5

Evaluation of Resist Stripping Time Depending on Use of Alcohol Having Cyclic Ether Bond as Polar Solvent In order to evaluate the resist stripping time depending on the use of alcohol having a cyclic ether bond as a protic polar solvent, a photoresist was applied to a thickness of about 2 μm on a 4-inch bare glass substrate, and then hard-baked at 170° C. for 10 min thus preparing a resist-applied substrate under severe conditions. The substrate was cut to a size of 1.5 cm (width)×1.5 cm (length), immersed at 50° C. in the resist stripping solution composition of each of Examples 3, 11, 15 and 16, cleaned and dried, followed by measuring the time at which the resist was completely stripped and the resist residue was not observed with the naked eye. Five measurements per resist stripping solution composition were performed. The time range over which the resist was completely stripped is shown in Table 10 below.

TABLE 10

| | Resist Stripping Time (min) |
|---|---|
| Ex. 3 | 22~25 |
| Ex. 11 | 10~14 |
| Ex. 15 | 24~28 |
| Ex. 16 | 13~16 |

As shown from Table 10, the resist stripping solution compositions of Examples 11 and 16 containing the alcohol having a cyclic ether bond as the polar solvent exhibited resist stripping times much shorter than the resist stripping solution compositions of Examples 3 and 15 which do not contain the alcohol having a cyclic ether bond.

The invention claimed is:

1. A resist stripping solution composition, comprising (a) a basic compound including one or more selected from among compounds represented by Formulas 1 to 3 below, (b) an amide compound represented by Formula 4 below, (c) a polar solvent, and (d) a polyol compound represented by Formula 5 below:

[Formula 1]

[Formula 2]

[Formula 3]

wherein $R_1$, $R_2$, $R_3$, $R_4$, $R_5$ and $R_6$ are each independently hydrogen, a C1~10 alkyl group substituted or unsubstituted with amino, a C2~10 alkenyl group, a C1~10 hydroxyalkyl group, a carboxylic group, a C1~10 alkyl group substituted with C1~10 alkoxy substituted or unsubstituted with hydroxyl, an amino group substituted or unsubstituted with C1~4 alkyl, a phenyl group, or a benzyl group;

[Formula 4]

wherein $R_7$, $R_8$ and $R_9$ are each independently hydrogen, a C1~5 alkyl group, a C2~5 alkenyl group, a C1~10 hydroxyalkyl group, a carboxylic group, a C1~5 alkyl group substituted with C1~10 alkoxy, or an amino group substituted or unsubstituted with C1~4 alkyl; and

[Formula 5]

wherein $R_{10}$ and $R_{11}$ are each independently a C1~10 alkylene group, a C2~10 alkenylene group, a C1~10 hydroxyalkylene group, a C1~10 alkylene group substituted with C1~10 alkoxy, or a bond,
wherein, based on a total weight of the resist stripping composition, the resist stripping solution composition includes, (a) 5~30 wt % of the basic compound including one or more compounds represent by Formulas 1 to 3, (b) 20~80 wt % of the amide compound represented by Formula 4, (c) 10~70 wt % of the polar solvent, and (d) 0.05~20 wt % of the polyol compound represented by Formula 5.

2. The resist stripping solution composition according to claim 1, wherein the compound represented by Formula 1 of the (a) basic compound comprises monoethanolamine, triethanolamine, 1-amino-2-propanol, 2-(2-aminoethoxy)ethanol, N-methylethanolamine, N-methyldiethanolamine, N,N-dimethylethanolamine, N,N-diethylaminoethanol, or 2-(2-aminoethylamino)-1-ethanol; the compound represented by Formula 2 comprises morpholine, N-(3-aminopropyl)morpholine, N-(methoxymethyl)morpholine, N-(butoxymethyl)morpholine, or N-(2-hydroxyethyl)morpholine; and the compound represented by Formula 3 comprises piperazine, 1-methylpiperazine, 2-methylpiperazine, 1,4-dimethylpiperazine, 1,4-diethylpiperazine, 1-(2-hydroxyethyl)piperazine, 1-(2-hydroxyethyl)-4-methylpiperazine, 1-(2-aminoethyl)piperazine, 1-amino-4-methylpiperazine, 1-benzylpiperazine, 1-phenylpiperazine, N,N'-di(methoxymethyl)piperazine, or di(butoxymethyl)piperazine.

3. The resist stripping solution composition according to claim 1, wherein the (b) amide compound represented by Formula 4 comprises one or more selected from the group consisting of formamide, N-methylformamide, N,N-dimethylformamide, acetamide, N-methylacetamide, N,N-dimethylacetamide, N-(2-hydroxyethyl)acetamide, 3-methoxy-N,N-dimethylpropionamide, 3-(2-ethylhexyloxy)-N,N-dimethylpropionamide, and 3-butoxy-N,N-dimethylpropionamide.

4. The resist stripping solution composition according to claim 1, wherein the (c) polar solvent comprises one or more selected from the group consisting of ethyleneglycol monomethyl ether, ethyleneglycol monoethyl ether, ethyleneglycol monoisopropyl ether, ethyleneglycol monobutyl ether, diethyleneglycol monomethyl ether, diethyleneglycol monoethyl ether, diethyleneglycol monoisopropyl ether, diethyleneglycol monobutyl ether, triethyleneglycol monomethyl ether, triethyleneglycol monoethyl ether, triethyleneglycol monoisopropyl ether, triethyleneglycol monobutyl ether, polyethyleneglycol monomethyl ether, polyethyleneglycol monobutyl ether, propyleneglycol monomethyl ether, dipropyleneglycol monomethyl ether, tripropyleneglycol monomethyl ether, propyleneglycol monomethyl ether acetate, alcohols having a cyclic ether bond, pyrrolidone compounds, imidazolidinone compounds, lactone compounds, sulfoxide compounds, phosphate compounds, and carbonate compounds.

5. The resist stripping solution composition according to claim 4, wherein the (c) polar solvent comprises one or more alcohols having a cyclic ether bond.

6. The resist stripping solution composition according to claim 5, wherein the alcohols having a cyclic ether bond are selected from the group consisting of furfuryl alcohols and tetrahydrofurfuryl alcohols.

7. The resist stripping solution composition according to claim 4, wherein the (c) polar solvent comprises one or more protic polar solvents and one or more aprotic polar solvents.

8. The resist stripping solution composition according to claim 1, wherein the (d) polyol compound represented by Formula 5 comprises one or more selected from the group consisting of cyclohexane 1,4-diol, cyclohexane 1,4-dimethanol, and cyclohexane 1,4-diethanol.

9. The resist stripping solution composition according to claim 1, wherein the resist stripping solution composition is used to strip a resist from a flat panel substrate having metal wiring including aluminum or copper.

10. A method of stripping a resist, comprising:
depositing a conductive metal layer on a substrate for a flat panel display;
forming a resist layer on the conductive metal layer;
subjecting the resist layer to selective photo-exposure;
developing the resist layer, thus forming a resist pattern;
etching the conductive metal layer using the resist pattern as a mask; and
stripping the resist which was deteriorated and cured due to the forming of the resist pattern and the etching, using the resist stripping solution composition of claim 1.

11. A method of manufacturing a flat panel for a display, comprising stripping a resist from a flat panel substrate using the resist stripping solution composition of claim 1.

12. A method of manufacturing a flat panel display, comprising stripping a resist from a flat panel substrate using the resist stripping solution composition of claim 1.

* * * * *